United States Patent
Chang et al.

(10) Patent No.: US 7,902,674 B2
(45) Date of Patent: Mar. 8, 2011

(54) THREE-DIMENSIONAL DIE-STACKING PACKAGE STRUCTURE

(75) Inventors: Hsiang-Hung Chang, Hsin Chu Hsien (TW); Shu-Ming Chang, Hsin Chu Hsien (TW)

(73) Assignee: Industrial Technology Research Institute, Hsin Chu Hsien (TW)

( * ) Notice: Subject to any disclaimer, the term of this patent is extended or adjusted under 35 U.S.C. 154(b) by 193 days.

(21) Appl. No.: 12/155,715

(22) Filed: Jun. 9, 2008

(65) Prior Publication Data

US 2009/0014891 A1 Jan. 15, 2009

(30) Foreign Application Priority Data

Jul. 11, 2007 (TW) ................................ 96125246 A

(51) Int. Cl.
*H01L 21/31* (2006.01)

(52) U.S. Cl. .. 257/777; 257/782; 257/778; 257/E23.067; 438/109; 438/110; 438/113

(58) Field of Classification Search .......... 257/777–778, 257/689–690; 438/109–113
See application file for complete search history.

(56) References Cited

U.S. PATENT DOCUMENTS

| | | | |
|---|---|---|---|
| 5,466,634 A | 11/1995 | Beilstein, Jr. et al. | |
| 6,429,096 B1 | 8/2002 | Yanagida | |
| 6,444,576 B1 | 9/2002 | Kong | |
| 6,596,611 B2 | 7/2003 | Lu et al. | |
| 6,809,421 B1 | 10/2004 | Hayasaka et al. | |
| 6,815,046 B2 | 11/2004 | Mandai et al. | |
| 7,598,617 B2 * | 10/2009 | Lee et al. | 257/777 |
| 2005/0230804 A1 * | 10/2005 | Tanida et al. | 257/690 |
| 2005/0263869 A1 * | 12/2005 | Tanaka et al. | 257/686 |

* cited by examiner

*Primary Examiner* — Dung A. Le

(74) *Attorney, Agent, or Firm* — Birch, Stewart, Kolasch & Birch, LLP

(57) ABSTRACT

This invention provides a substrate having at least one bottom electrode formed therein. A plurality of dice each having at least one opening formed therein are vertically stacked together one by one by a polymer insulating layer acting as an adhering layer between them, along with the openings thereof aligned to each other to form a through hole passing through said dice. The stacked dice are joined to a bottom of the substrate with the polymer insulating layer acting as an adhering layer, making the bottom electrode of the substrate contact the through hole. An electroplating process is performed with the bottom electrode serving as an electroplating electrode to form a conductive contact passing through the dice.

20 Claims, 6 Drawing Sheets

THREE-DIMENSIONAL DIE-STACKING PACKAGE STRUCTURE

BACKGROUND OF THE INVENTION

1. Field of the Invention

The present invention relates to a three-dimensional die-stacking package structure and a method for manufacturing the same; and more particularly to a wafer level three-dimensional die-stacking package structure and a method for manufacturing the same.

2. Description of the Related Art

Because the three-dimensional die-stacking package structure has short signal transmission distance, the three-dimensional die-stacking package structure has always had high performance in telecommunications and been applicable to quality package structures of high-speed devices. By being vertically stacked, the three-dimensional die-stacking package structure is also able to significantly reduce its size to meet the slim and compact trend in the industry and to multiply its memory capacity under given package size in terms of memory packaging. One of the major technique features involved in the process of the three-dimensional die-stacking package structure is to form the through silicon via. To make it, one of the challenging tasks facing the industry is to perform high aspect ratio drilling as well as high aspect ratio blind via plating. Chemical vapor deposition is used to form a seedlayer and a silicon dioxide insulating layer before the through hole metalizing process by a uniquely designed electroplating station. However, expensive equipments are always required to form the bottom metal electrode or the silicon dioxide insulating layer under the chemical vapor deposition process. As a result, traditional techniques always cost a lot of money. Besides, not every packaging house can afford such a high-priced chemical vapor deposition station or uniquely designed electroplating station for the plating of the high aspect ratio through hole.

Therefore, by providing an improved three-dimensional die-stacking package structure without requiring expensive metallic chemical vapor deposition process and silicon dioxide chemical vapor deposition process, and allowing the packaging house to utilize the existing electroplating station to fill the through hole, the manufacturing costs can be substantially reduced.

SUMMARY OF THE INVENTION

The present invention provides a three-dimensional die-stacking package structure and a method for manufacturing the same, in which a plurality of dice each having at least one opening are vertically stacked together with a polymer insulating layer acting as an adhering layer in between, so as to form a through hole passing through the stacked dice. Such stacked dice are then joined underneath a top substrate having at least one bottom electrode to perform an electroplating process in the through hole with the bottom electrode served as an electroplating electrode, and forming a conductive contact passing through the stacked dice and completing the electrical connections of the conductive wires among the stacked dice.

The three-dimensional die-stacking package structure according to the present invention at least comprises a first die and a second die. The first die at least has a first insulating layer, a first conductive contact and a first conductive contact pad. The first insulating layer is formed on an upper surface of the first die and on a surrounding wall of the first conductive contact. The first conductive contact passes through the first die and has the first conductive contact pad formed on its top end. The second die is stacked underneath the first die and at least has a second insulating layer, a second conductive contact and a second conductive contact pad. The second insulating layer is formed on a surface, corresponding to the first die, of the second die and on the surrounding wall of the second conductive contact that passes through the second die. The second conductive contact pad is formed on a top end of the second conductive contact to be electrically connected to a bottom of the first conductive contact.

The method for manufacturing a three-dimensional die-stacking package structure according to the present invention comprises providing a first wafer having a plurality of dice; forming at least a first opening in each of the dice; forming a first insulating layer on the dice; removing partial portions of the first insulating layer corresponding to the first openings so as to form a second opening in each of the dice; providing a top substrate stacked on and jointed to the first insulating layer and having a plurality of bottom electrodes formed therein, with each of the second openings contacting one of the bottom electrodes; thinning the first wafer so as to expose the second openings; repeating the abovementioned first step through fourth step and the sixth step at least one time, so as to form at least a second wafer having a plurality of dice; having the first insulating layer of the second wafer stacked on a backside of the first wafer, allowing the second opening of each of the dice in the second wafer to be aligned with the second opening of the corresponding die in the first wafer; and performing an electroplating process to form a conductive contact passing through both the first die and the second die.

Another method for manufacturing a three-dimensional die-stacking package structure of the present invention comprises: providing a first wafer having a plurality of dice; forming at least a first opening in each of the dice; forming a first insulating layer on the dice; removing partial portions of the first insulating layer corresponding to the first openings, so as to form a second opening in each of the dice; thinning the first wafer to expose the second openings; repeating the preceding steps at least one time, so as to form at least a second wafer; having the insulating layer of the second wafer jointed to a backside of the first wafer, allowing the second opening of each of the dice in the second wafer to be aligned with the second opening of the die corresponding thereto in the first wafer; providing a top substrate stacked atop the insulating layer of the first wafer and having a plurality of bottom electrodes, with each of said second openings in the first wafer contacting one of the bottom electrodes; and performing an electroplating process to form a conductive contact passing through both the first die and the second die.

According to the present invention, the bottom electrode of the top substrate is intended for the electroplating of the bottom opening of the three-dimensional die-stacking package structure. Through the invention, costly chemical vapor deposition machines and specially designed electroplating machines are no longer required to form a metal seedlayer and via metalizing.

DETAILED DESCRIPTION OF THE PREFERRED EMBODIMENTS

The three dimensional die-stacking package structure provided by the present invention will be explained in detail through the following embodiments by reference to the accompanying drawings.

Figure 1A:
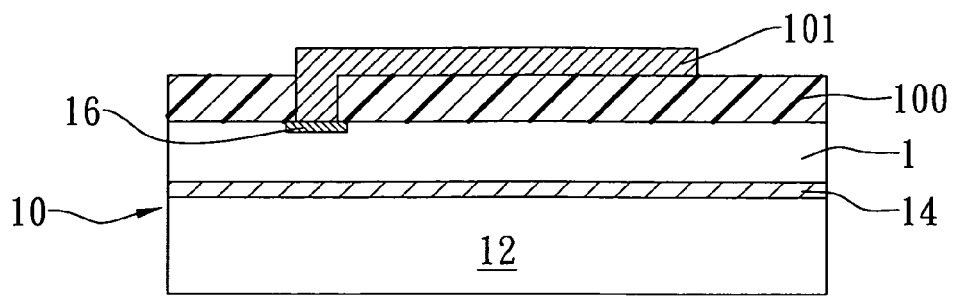
FIGS. 1A to 1H show various cross-sectional views corresponding to respective steps involved in the manufacture of a three-dimensional die-stacking package structure according to a first embodiment of the present invention.
Figure 1B:
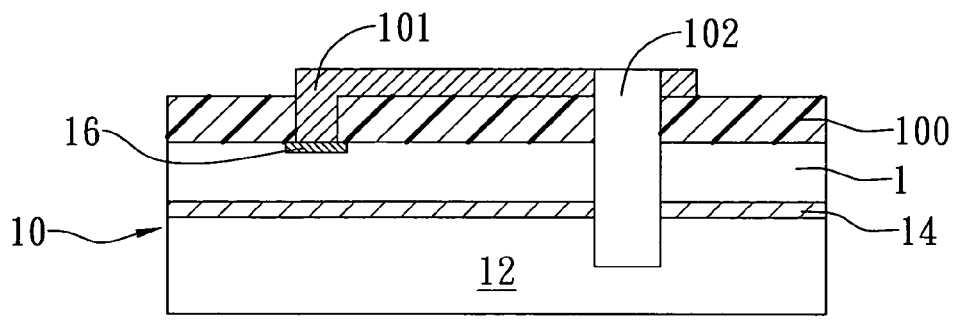
Figure 1C:
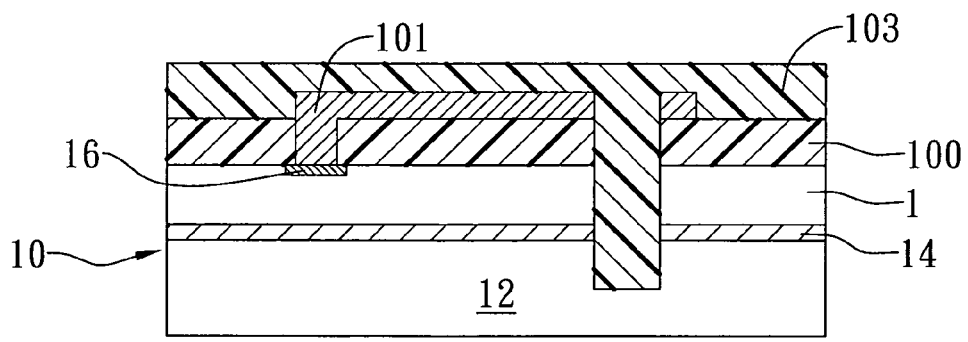
Figure 1D:
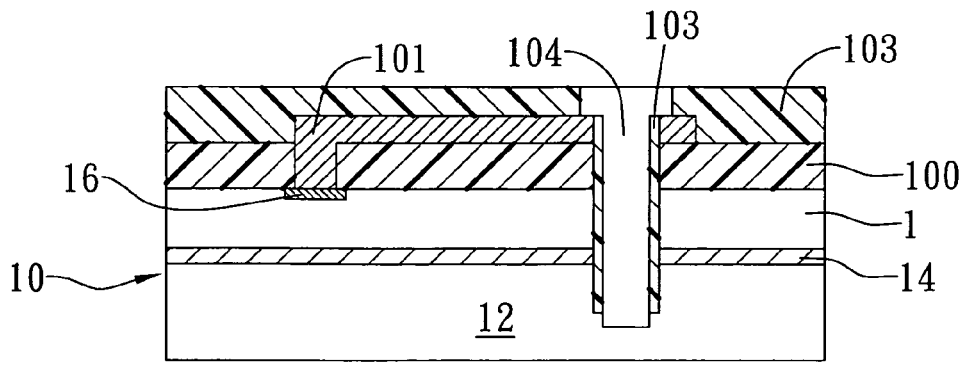
Figure 1E:
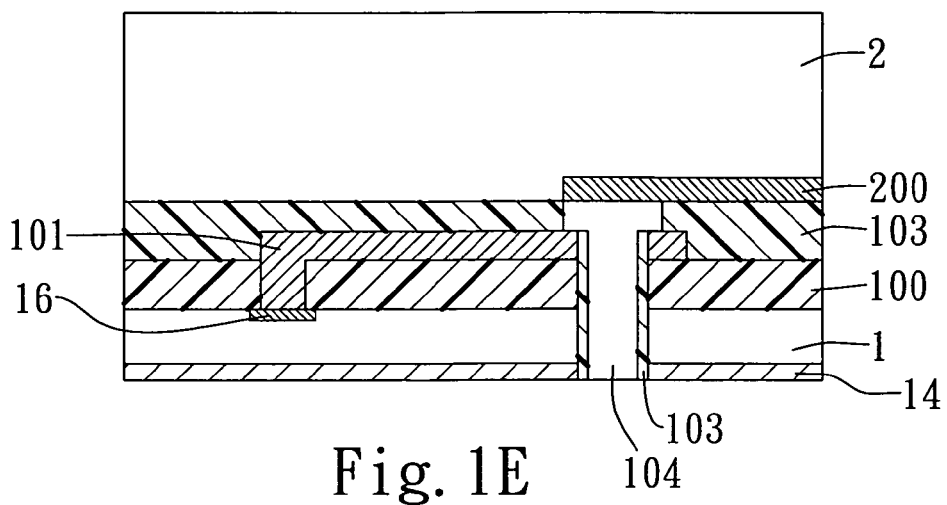
Figure 1F:
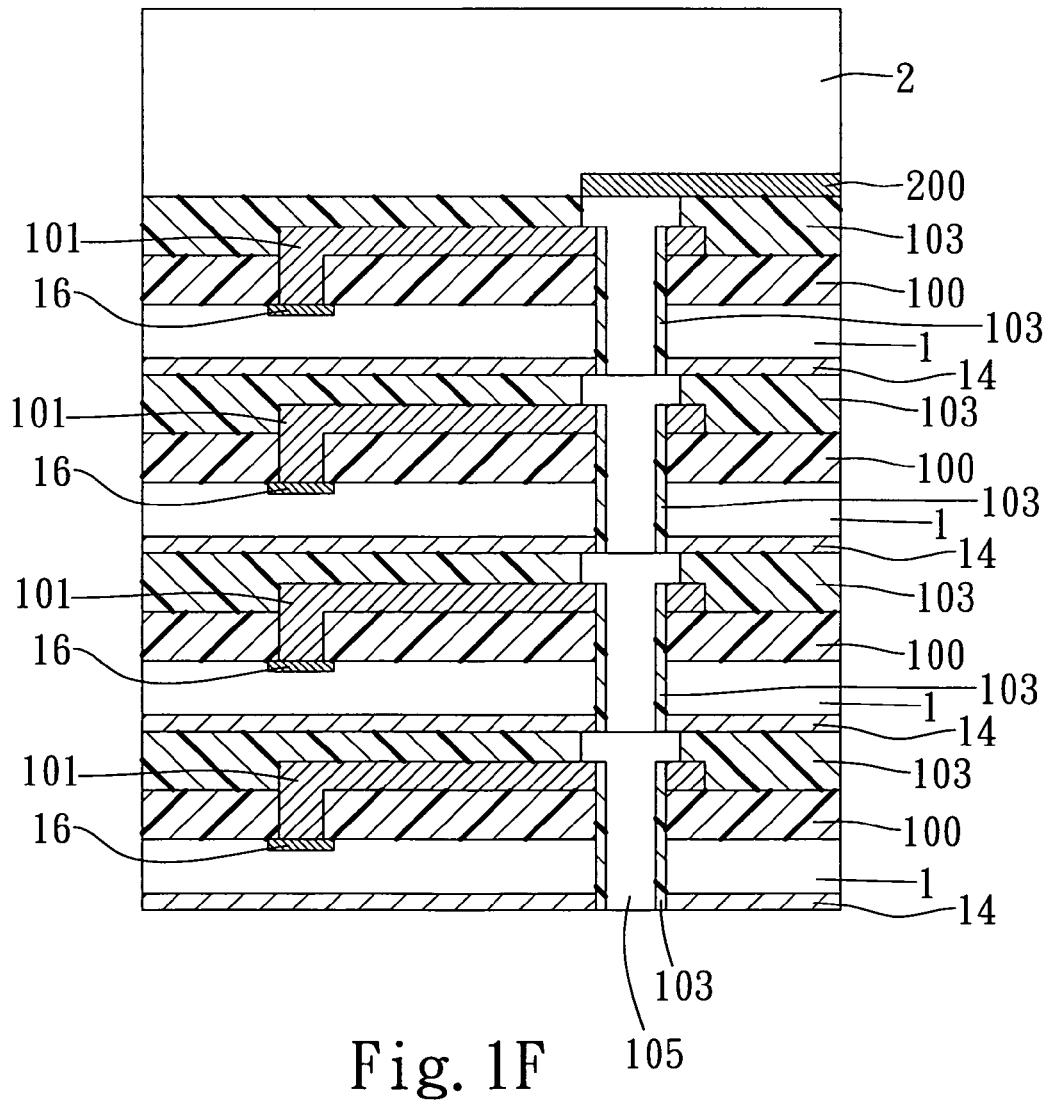
Figure 1G:
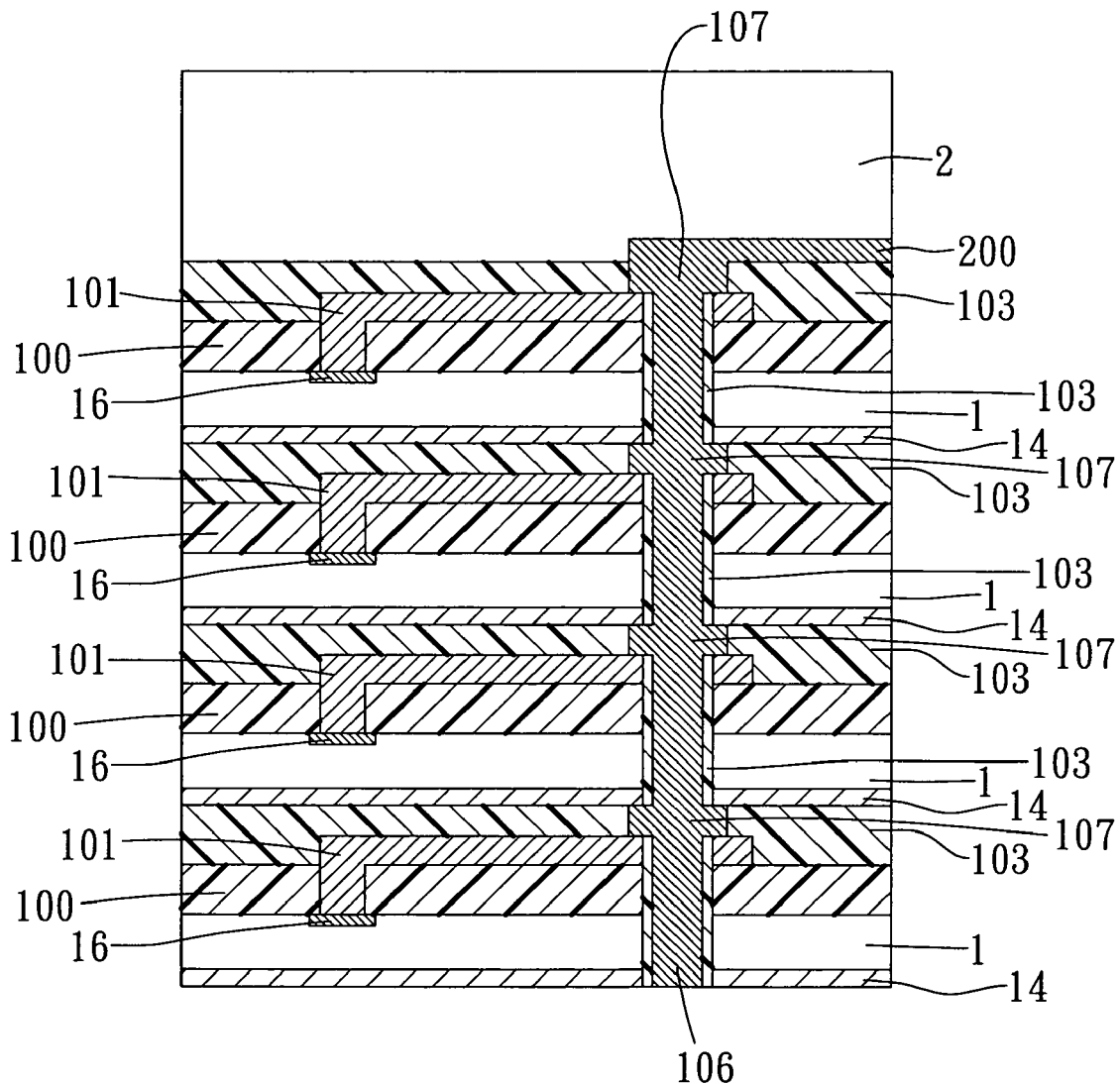
Figure 1H:
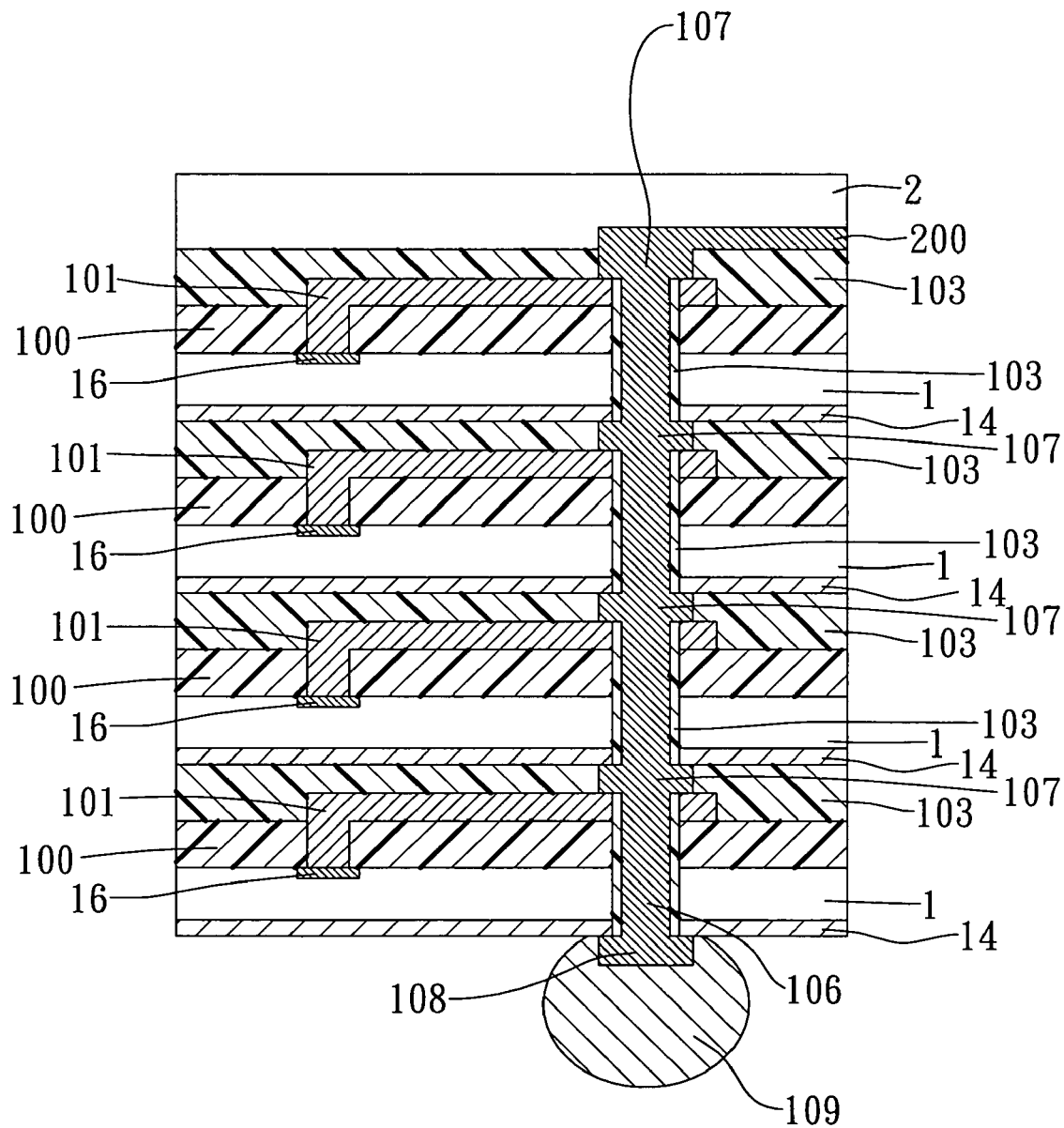

FIGS. 1A to 1H show the various cross-sectional views corresponding to the respective steps involved in the manufacture of a three-dimensional die-stacking package structure according to a first embodiment of the present invention. The following descriptions, by reference to FIGS. 1A to 1H, exemplify the manufacturing process of the three-dimensional die-stacking package structure according to the first embodiment of the present invention. First, referring to FIG. 1A, a SOI wafer (Silicon-On-Insulator Wafer) 10 is provided, which has a plurality of IC dice 1 formed on an insulating layer 14 on a wafer 12. A polymer insulating layer 100, such as a polyimide film, an Ajinomoto Build-up film, a SU-8, or a Benezo-cyclobutene resin (BCB), is formed on the SOI wafer 10, and subsequently a redistribution conductive wire layer 101 is formed on the polymer insulating layer 100. The redistribution conductive wire layer 101 is electrically connected to one IC pad 16 of the IC dice 1 corresponding thereto. Then, as shown in FIG. 1B, laser drilling is performed to form at least a first opening 102 in each of the IC dice, with the first opening 102 passing through the redistribution conductive wire layer 101. Further, referring to FIG. 1C, another polymer insulating layer 103, such as a polyimide film, an ABF layer, or a BCB layer, is formed on the redistribution conductive wire layer 101 by vacuum lamination or coating and is filled into the first opening 102, constituting an insulating layer covering the redistribution conductive wire layer 101 and an inner surrounding wall of a second opening 104 (see FIG. 1D) subsequently formed. Subsequently, with reference to FIG. 1D, a laser drilling process is performed to remove partial portion of the polymer insulating layer 103 corresponding to the first opening 102, so as to form the second opening 104 in where the first opening 102 used to be. Then, in FIG. 1E, the bottom of the SOI wafer 10 is thinned to the insulating layer 14, and exposing the second opening 104 in each of the IC dice 1 after a top substrate 2 is stacked atop the polymer insulating layer 103 of the SOI wafer 10 by vacuum lamination. The top substrate 2 contains a specific metal wire distribution layer, providing a plurality of mutually connected bottom metal electrodes 200. Each of the bottom metal electrodes 200 is in contact with the second opening 104 corresponding thereto in one of the IC dice 1, so as to serve as a bottom electroplating electrode in the subsequent electroplating process. Preferably, the top substrate 2 is good at heat dissipation, so that heat stemmed from the completed three-dimensional die-stacking package structure can be quickly transmitted to the surface to be dissipated. In addition to having the top substrate 2 stacked atop the SOI wafer 10 as shown in FIG. 1E, FIG. 1F further includes measures to repeat those steps respectively corresponding to FIGS. 1A to 1E to make a plurality of SOI wafers 10 having been thinned to the insulating layer 14 thereof, each of which having a plurality of IC dice 1 formed therein and to take the polymer insulating layer 103 on each SOI wafer 10 as an adhering layer in between to stack the individually completed SOI wafers 10 together by vacuum lamination in a back-to-face manner and in such an order that, beginning from the top, every single SOI wafer 10 sits in the prescribed direction on an upper side of the following one, wherein the insulating layer 14 of each SOI wafer 10 is jointed to the polymer insulating layer 103 of the following one. In other words, the IC dice 1 contained respectively in each of the SOI wafers 10 are stacked together in a back-to-face manner and in such an order that, starting from the top, every single IC die sits in the prescribed direction on the upper side of the following one; and the second openings 104 in the IC dice 1 corresponding thereto are aligned with each other, forming a through hole 105 passing through the IC dice 1 and allowing one single bottom electrode 200 of the top substrate 2 to serve as the electroplating electrode for its corresponding through hole 105. Subsequently, referring to FIG. 1G, an electroplating process is performed to form a metal contact 106 in each of the through holes 105 and, meanwhile, to form a first metal contact pad 107 in where the metal contact 106 and the bottom metal electrode 200 meet. The first metal contact pad 107, also, is electrically connected to the redistribution conductive wire layer 101 of the topmost IC die 1, so as to establish electrical communication with the topmost IC die. In addition, during the electroplating process, a part of the metal contact 106 corresponding to one of the stacked IC dice will also form a first metal contact pad 107 to be electrically connected to the respective redistribution conductive wire layer 101 on the IC die 1 corresponding thereto. As such, each of the stacked IC dice 1 will become electrically connected to each other in an automatic and orderly manner during the electroplating process. Please note that the insulating layer 14 of each single SOI wafer 10 can avoid current leakage between the IC die 1 and the first metal contact pad 107 nearby. Then, as shown in FIG. 1H, a second metal contact pad 108 is formed at a bottom end of each of the metal contacts 106, with a conductive bump 109, such as a conductive solder ball, formed underneath such a second metal contact pad 108, so as to establish electrical communication between every three-dimensional die-stacking package structure and the external environment and to complete the wafer level three-dimensional die-stacking package structure of the present invention. The top substrate 2 can be ground thin to reduce the volume of the wafer level three-dimensional die-stacking package structure. Finally, to separate these three-dimensional die-stacking package structures from the wafer, dicing is performed following the scribe lines either on the top substrate 2 or on the bottommost wafer. The cross-sectional view of every single three-dimensional die-stacking package structure is shown in FIG. 1H. Given that the scribe lines on the top substrate 2 are formed between adjacent bottom metal electrodes 200, the three-dimensional die-stacking package structures can be separated without worrying about short circuit from the bottom metal electrode 200.

A variance of the method for manufacturing a three-dimensional die-stacking package structure according to the first embodiment of the present invention begins with the completion of the manufacture of the multiple respective SOI wafers 10 each of which containing a plurality of IC dice 1 on the insulating layer 14 and the polymer insulating layer 100 on the surface of the SOI wafer 10 opposite to the insulating layer 14, followed by taking the polymer insulating layer 103 on the polymer insulating layer 100 of each SOI wafer 10 as an adhering layer in between to stack such SOI wafers 10 together in a back-to-face manner and in a way that every single SOI wafer 10 sits in the prescribed direction on the upper side of the following one, wherein the insulating layer 14 of each SOI wafer 10 is jointed to the polymer insulating layer 103 of the following one. Then, the top substrate 2 is stacked atop the polymer insulating layer 103 of the topmost SOI wafer, so as to produce a wafer level three-dimensional die stacking package structure as that in FIG. 1F with through holes 105. As with above, by reference to FIG. 1G and FIG. 1H, the forming of the metal contact 106, the second metal contact pad 108, and the conductive bump 109 will continue until completion.

Figure 2:
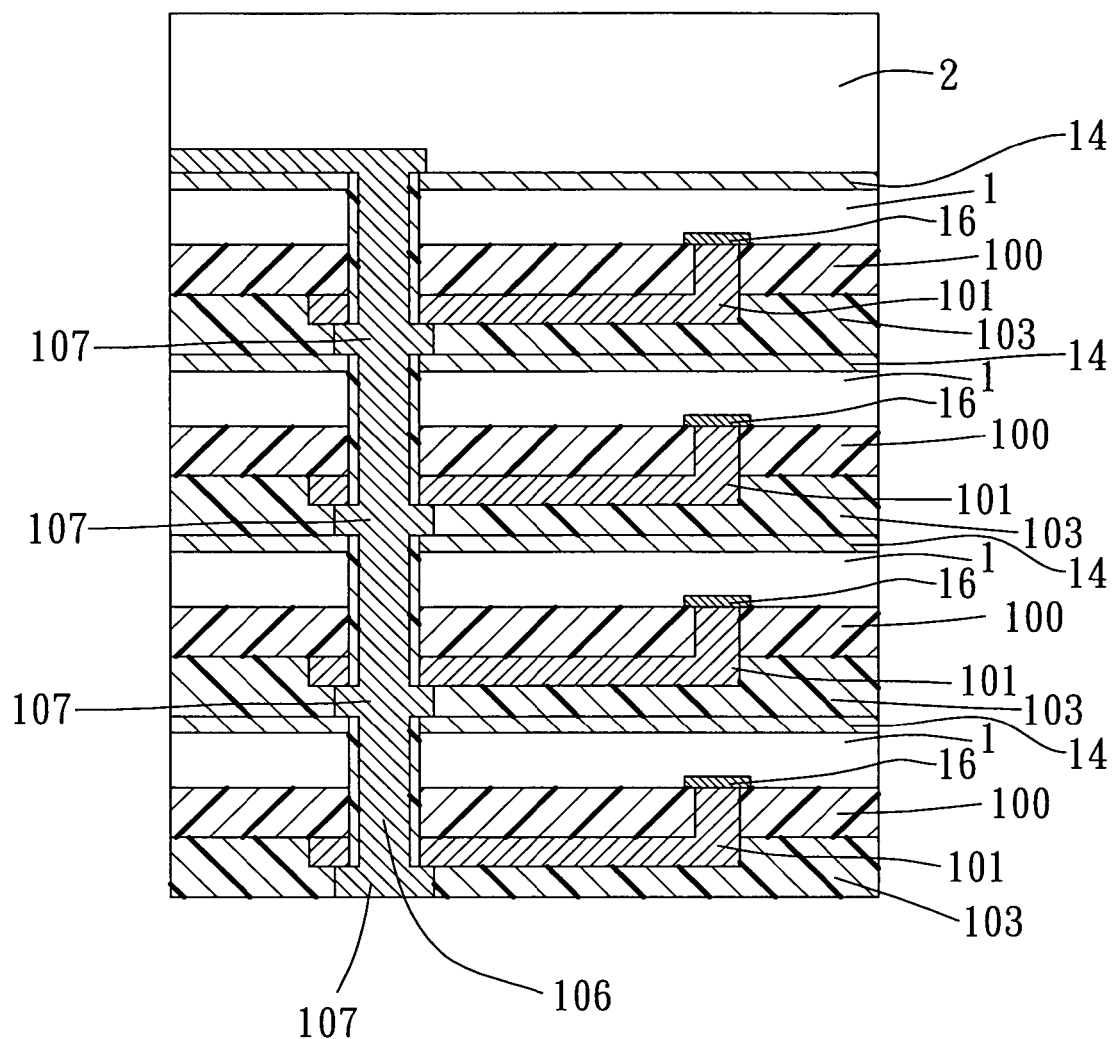
FIG. 2 shows a cross-sectional view of a three-dimensional die-stacking package structure according to a second embodiment of the present invention.

FIG. 2 shows a cross-sectional view of a second embodiment of the three-dimensional die-stacking package structure of the present invention. It should be noted that layers in FIG. 2 correspond to those with the same reference numbers in FIG. 1G. In this embodiment, the top substrate 2 is stacked on a backside of the aforementioned SOI wafer 10 that contains a plurality of IC dice 1 on the insulating layer 14 thereof. The three-dimensional die-stacking package structure comprises, but not limited to, four die units stacked together in a face-to-back manner with a top substrate 2 stacked on the backside of the topmost die unit. More specifically, every die unit uses the polymer insulating layer 103 on its upper side to join the insulating layer 14 on the backside of its following die unit, with its first metal contact pad 107 electrically connected to the bottom of the metal contact 106 of its following die unit. Moreover, the bottom electrode 200 of the top substrate 2 is electrically connected to the bottom of the metal contact 106 of the aforementioned topmost die unit.

Figure 3:
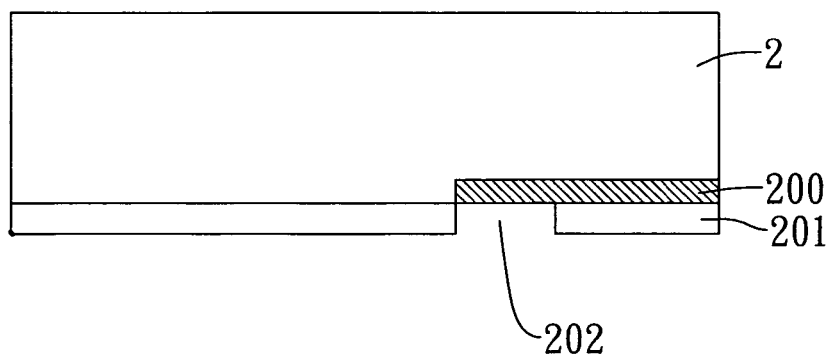
FIG. 3 shows a cross-sectional view of a variance of a top substrate of the present invention.

With reference to yet another variance of the method for manufacturing a three-dimensional die-stacking package structure according to the present invention, a release layer 201 is laminated or coated to the bottom of the bottom electrode 200 of the top substrate 2 and a via hole 202 is formed in the release layer 201 by laser drilling or photolithography process to expose part of the bottom electrode 200, as shown in FIG. 3. Then, the top substrate 2 is stacked upon the topmost die unit, the via hole 202 is aligned with the through hole 105 in each of the die units, enabling the bottom electrode 200 to serve as an electroplating electrode to perform the electroplating process in the through holes 105. Upon the completion of the electroplating process, the top substrate 2 can be removed through the design of the release layer 201.

Figure 4A:
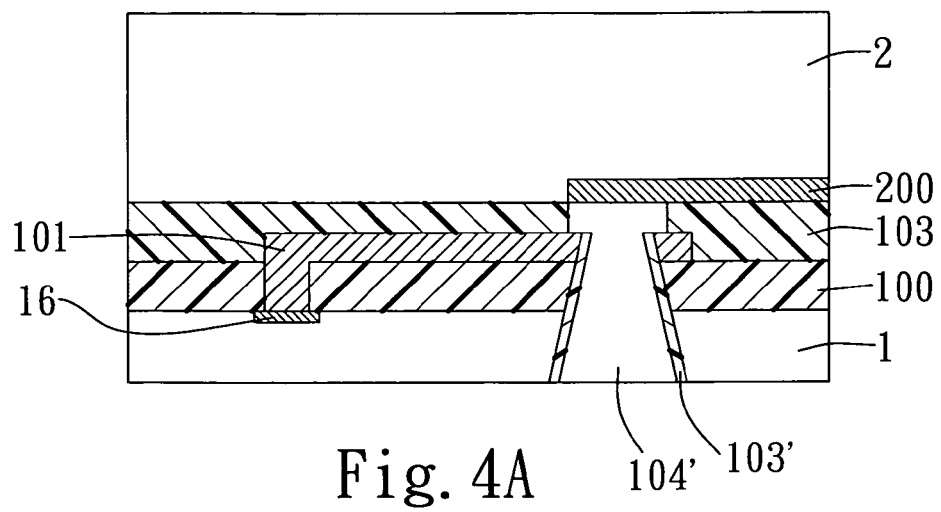
FIG. 4A shows a partial cross-section view of a wafer having IC dice contained therein and with a top substrate.
Figure 4B:
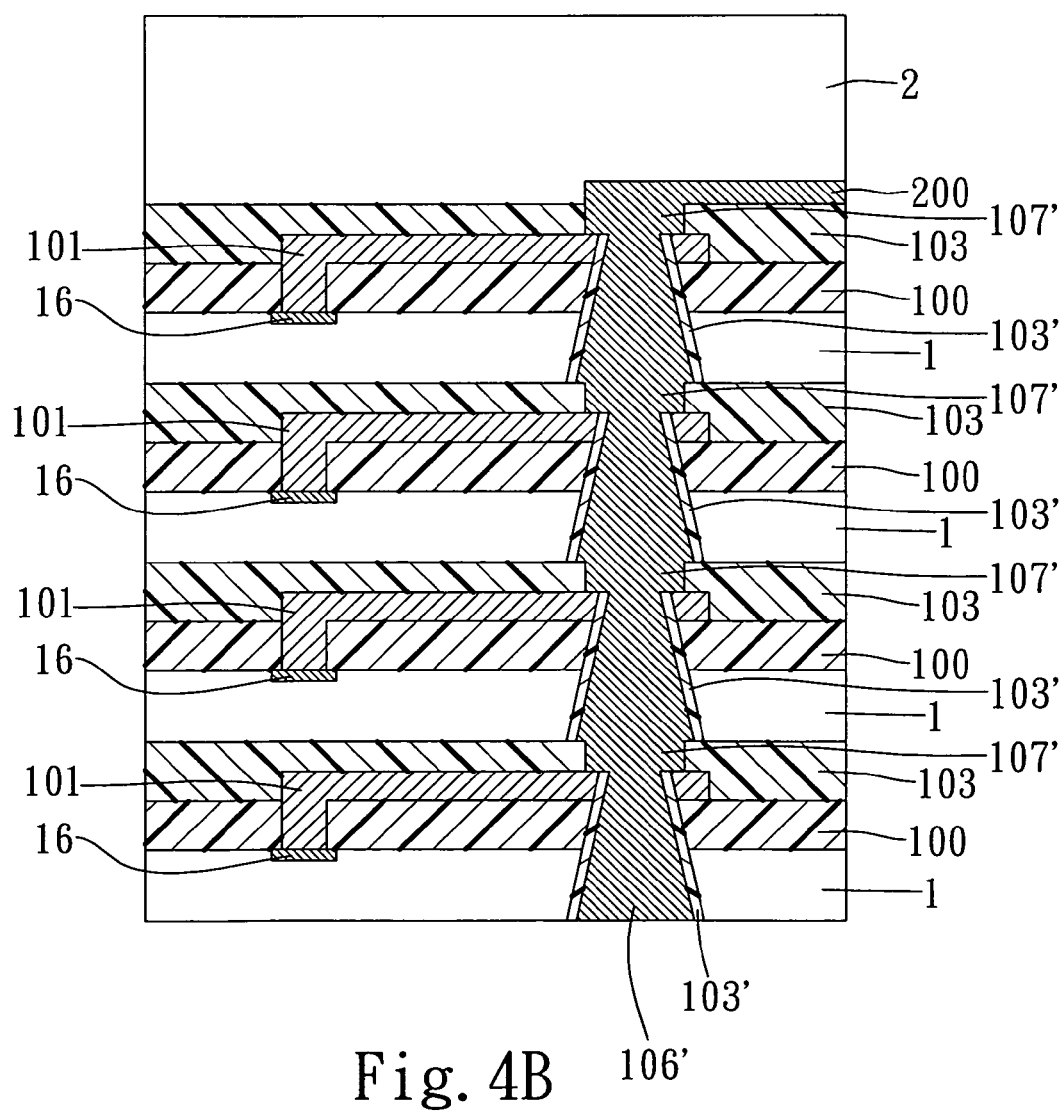
FIG. 4B shows a cross-sectional view of a three-dimensional die-stacking package structure according to a third embodiment of the present invention.

FIG. 4A is a partial cross-section view of a wafer having IC dice 1 contained therein and with a top substrate 2 on a top thereof. FIG. 4B shows a cross-sectional view of a three-dimensional die-stacking package structure according to a third embodiment of the present invention, in which a plurality of wafers shown in FIG. 4A is vertically stacked. Referring to FIGS. 4A and 4B, in the third embodiment of the present invention, a wafer instead of the SOI wafer is provided, and the second opening 104' passing through the wafer is tapering from bottom to top. For example, the second opening 104' can be conic-shaped with its opening tapered from bottom to top. More specifically, the differences of the dice structure between FIG. 4A and FIG. 1E are the dice 1 of FIG. 4A are formed on the wafer but the dice 1 of FIG. 1E are formed on the SOI wafer and the second opening 104' of FIG. 4A corresponding to each of the dice 1 is conic-shaped with its opening tapering from bottom to top, but the second opening 104 of FIG. 1E is not. Referring to FIG. 4B, the dice unit of FIG. 4A are vertically stacked together in a back-to-face manner such that the periphery of the larger bottom portion of the second opening 104' of each single dice unit is jointed to and covers partial of the polymer insulating layer 103 of the following dice unit, the second openings 104' of the stacked dice units corresponding thereto are aligned to form a through hole passing through the stacked dice units. Then, the electroplating process is performed to form the metal contact 106' in the through hole. Meanwhile, a metal contact pad 107' is formed on where the metal contact 106' and the bottom metal electrode 200 meet. A metal contact pad 107', also, is formed on and electrically connected to the redistribution conductive wire layer 101 of each single dice unit, so as to establish electrical communication among the stacked dice units. Please note that because the portion of the metal contact 106' of each single dice unit joined to the polymer insulating layer 103 of the following dice unit is also covers partial of the polymer insulating layer 103. Every die 1 of the single dice unit is insulated from the metal contact pad 107' of the following dice unit by the polymer, insulating layer 103' and 103, and a current leakage therebetween is prohibited. In the present invention, the top substrate 2, through the specially designed conductive lines therein, provides the through holes of the underneath three-dimensional die-stacking package structures with bottom electroplating electrodes, so as to perform electroplating process in the openings of the three-dimensional die-stacking package structures without utilizing a costly chemical vapor deposition process to form a seedlayer beforehand to serve as the electroplating electrode for each of the through holes. Besides, the top substrate 2 can be made of heat-dissipative materials, such as silicon, ceramic, silicon carbide, metal or their combinations, so that heat stemmed from the completed three-dimensional die-stacking package structure can be quickly transmitted to the surface to be dissipated. Alternatively, the top substrate 2 can also be excluded from the three-dimensional die-stacking package structure. Moreover, the present invention also utilizes economical polymer materials to serve as the insulating layer and the adhering layer between wafers to take place of the costly silicon dioxide layer formed by the chemical vapor deposition process. The present invention also replaces the expensive inductively coupled plasma (ICP) process with the inexpensive laser drilling process.

The examples given above serve as the preferred embodiments of the present invention only. The examples should not be construed as a limitation on the actual applicable scope of the invention, and as such, all modifications and alterations without departing from the spirits of the invention and appended claims, including other embodiments, shall remain within the protected scope and claims of the invention.

What is claimed is:

1. A three-dimensional die-stacking package structure, at least comprising a first die, a second die stacked under said first die and a conductive contact passing through said first die and said second die, wherein said first die at least has a first insulating layer and a first conductive contact pad, said first insulating layer is formed on an upper surface of said first die and on a surrounding wall of a part of said conductive contact, which passes through said first die, and said first conductive contact pad is integrally formed on a top end of said conductive contact; and a said second die at least has a second insulating layer and a second conductive contact pad, wherein said second insulating layer is formed on a surface of said second die opposite to said first die and on a surrounding wall of a part of said conductive contact, which passes through said second die, and said second conductive contact pad is formed integrally with a portion of said conductive contact, which is formed between said first die and said second die.

2. The three-dimensional die-stacking package structure as claimed in claim 1, further comprising a top substrate having at least one bottom electrode electrically connected to said first conductive contact pad.

3. The three-dimensional die-stacking package structure as claimed in claim 2, wherein said top substrate is made of a heat-dissipating material selected from any of the following ones: silicon, ceramic, silicon carbide, metal and a combination thereof.

4. The three-dimensional die-stacking package structure as claimed in claim 1, further comprising a third conductive contact pad formed at a bottom of said conductive contact and a conductive bump formed at a bottom of said third conductive contact pad.

5. The three-dimensional die-stacking package structure as claimed in claim 1, wherein both said first insulating layer and said second insulating layer are made from polymer materials.

6. The three-dimensional die-stacking package structure as claimed in claim 5, wherein said first insulating layer and said second insulating layer are made from materials selected from any of the following ones: ABF (Ajinomoto Build-up Film), BCB resin (Benezo-cyclobutene resin), SU-8, or PI (Polyimide).

7. The three-dimensional die-stacking package structure as claimed in claim 1, wherein said first die further comprises a third insulating layer and a first redistribution conductive wire layer formed between said first die and said first insulating layer, with said first redistribution conductive wire layer disposed between a top of said third insulating layer and said first conductive contact pad such that said first redistribution conductive wire layer is electrically communicated with both said first conductive contact pad and said first die.

8. The three-dimensional die-stacking package structure as claimed in claim 1, wherein said second die further comprises a fourth insulating layer and a second redistribution conductive wire layer formed between said second die and said second insulating layer, with said second redistribution conductive wire layer disposed between a top of said fourth insulating layer and said second conductive contact pad such that said second redistribution conductive wire layer is electrically communicated with both said second conductive contact pad and said second die.

9. The three-dimensional die-stacking package structure as claimed in claim 7, wherein said second die further comprises a fourth insulating layer and a second redistribution conductive wire layer formed between said second die and said second insulating layer, with said second redistribution conductive wire layer disposed between a top of said fourth insulating layer and said second conductive contact pad such that said second redistribution conductive wire layer is electrically communicated with both said second conductive contact pad and said second die.

10. The three-dimensional die-stacking package structure as claimed in claim 7, wherein said third insulating layer is made from a polymer material.

11. The three-dimensional die-stacking package structure as claimed in claim 8, wherein said fourth insulating layer is made from a polymer material.

12. The three-dimensional die-stacking package structure as claimed in claim 9, wherein both said third insulating layer and said fourth insulating layer are made from polymer materials.

13. The three-dimensional die-stacking package structure as claimed in claim 1, wherein said first die further comprises a fifth insulating layer formed on its backside, said fifth insulating layer insulates said first die from said second conductive contact pad of said second die.

14. The three-dimensional die-stacking package structure as claimed in claim 4, wherein said first die further comprises a fifth insulating layer formed on its backside, said fifth insulating layer insulates said first die from said second conductive contact pad of said second die, and said second die further comprises a sixth insulating layer on its backside, said sixth insulating layer insulates said second die from said third conductive contact pad and said conductive bump.

15. The three-dimensional die-stacking package structure as claimed in claim 1, wherein a part of said conductive contact is tapering from one end corresponding to said second die to the other end corresponding to said first conductive contact pad so that a bottom periphery of said conductive contact covers partial of said second insulating layer, and also a part of said conductive contact is tapering from one end opposite to said second conductive contact pad to the other end corresponding to said second conductive contact pad.

16. A three-dimensional die-stacking package structure, at least comprising a first die, a second die and a conductive contact passing through said first die and said second die, wherein
said first die at least has a first insulating layer, a first conductive contact pad and a second insulating layer, said first insulating layer is formed on a front side of said first die and on a surrounding wall of a part of said first conductive contact, which passes through said first die and has said first conductive contact pad is integrally formed with a portion of said conductive contact between said first die and said second die, and said second insulating layer is formed on a backside of said first die; and
said second die is stacked under said first insulating layer of said first die and has at least a third insulating layer, a second conductive contact pad and a fourth insulating layer, wherein said third insulating layer is formed on a front side of said second die and on a surrounding wall of a part of said second conductive contact, which that passes through said second die, and said second conductive contact pad is integrally formed on a top end of said conductive contact, and said fourth insulating layer is formed on the backside of said second die and jointed to said first insulating layer of said first die.

17. The three-dimensional die-stacking package structure as claimed in claim 16, further comprising a top substrate having at least one bottom electrode, wherein said top substrate is jointed to and stacked on said second insulating layer of said first die, and said bottom electrode is electrically connected to a bottom of said conductive contact.

18. The three-dimensional die-stacking package structure as claimed in claim 16, wherein said first die further comprises a fifth insulating layer and a first redistribution conductive wire layer formed between said first die and said first insulating layer, with said first redistribution conductive wire layer disposed between a bottom of said fifth insulating layer and said first conductive contact pad such that said first redistribution conductive wire layer is electrically communicated with both said first conductive contact pad and said first die.

19. The three-dimensional die-stacking package structure as claimed in claim 16, wherein said second die further comprises a sixth insulating layer and a second redistribution conductive wire layer formed between said second die and said third insulating material, with said second redistribution conductive wire layer disposed between a bottom of said sixth insulating material and said second conductive contact pad such that said second redistribution conductive wire layer is electrically communicated with both said second conductive contact pad and said second die.

20. The three-dimensional die-stacking package structure as claimed in claim 18, wherein said second die further com prises a sixth insulating layer and a second redistribution conductive wire layer formed between said second die and said third insulating layer, with said second redistribution conductive wire layer disposed between a bottom of said sixth insulating layer and said second conductive contact pad such that said second redistribution conductive wire layer is electrically communicated with both said second conductive contact pad and said second die.

* * * * *